(12) United States Patent
Kawasumi (10) Patent No.: US 7,929,333 B2
(45) Date of Patent: Apr. 19, 2011

(54) SEMICONDUCTOR MEMORY DEVICE

(75) Inventor: Atsushi Kawasumi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 203 days.

(21) Appl. No.: 12/343,996

(22) Filed: Dec. 24, 2008

(65) Prior Publication Data

US 2009/0168500 A1    Jul. 2, 2009

(30) Foreign Application Priority Data

Dec. 28, 2007    (JP) ................................. 2007-340103

(51) Int. Cl.
*G11C 11/00* (2006.01)
(52) U.S. Cl. .................... 365/156; 365/154; 365/189.14; 365/203
(58) Field of Classification Search .................. 365/156, 365/154, 189.14–189.16, 203, 230.03
See application file for complete search history.

(56) References Cited

U.S. PATENT DOCUMENTS

| | | | |
|---|---|---|---|
| 6,023,428 A | 2/2000 | Tran | |
| 6,515,894 B2* | 2/2003 | Osada et al. ................... | 365/156 |
| 7,193,912 B2* | 3/2007 | Obara et al. ................... | 365/203 |
| 2003/0210565 A1 | 11/2003 | Adams et al. | |

FOREIGN PATENT DOCUMENTS

JP    59-165292    9/1984

OTHER PUBLICATIONS

U.S. Appl. No. 12/207,949, filed Sep. 10, 2008, Kawasumi, et al.

* cited by examiner

*Primary Examiner* — David Lam
(74) *Attorney, Agent, or Firm* — Oblon, Spivak, McClelland, Maier & Neustadt, L.L.P.

(57) ABSTRACT

A semiconductor memory device includes a sub array including a plurality of memory cells each holding data arranged therein; a memory cell array including a plurality of the sub arrays arranged therein; paired bit lines including a first bit line and a second bit line connected to each of the sub arrays; and a write/read circuit arranged to correspond to each of the sub arrays, writing data to the sub array, and reading data from the sub array, wherein a pair of the sub array and the write/read circuit is repeatedly arranged along the paired bit lines, allowing the data to be transferred via the write/read circuit and the paired bit lines.

9 Claims, 10 Drawing Sheets

|  | Precharge | Transfer |
|---|---|---|
| BLD[i] | 1 | 0 |
| Pre[i] | 0 | 1 |
| BLD[i+1] | 1 | 0 |
| Pre[i+1] | 0 | 1 |

| | Precharge | Transfer | Hi-Z |
|---|---|---|---|
| Trans[n] | × | 1 | 0 |
| Transb[n] | × | 0 | 1 |
| Pre[n] | 0 | 1 | 1 |

SEMICONDUCTOR MEMORY DEVICE

CROSS REFERENCE TO RELATED APPLICATIONS

This application is based on and claims the benefit of priority from prior Japanese Patent Application No. 2007-340103, filed on Dec. 28, 2007, the entire contents of which are incorporated herein by reference.

BACKGROUND OF THE INVENTION

1. Field of the Invention

The present invention relates to a static random access memory (SRAM) and particularly relates to a configuration of a write/read circuit and a structure of a bit line to which write/read data is transferred.

2. Description of the Related Art

An SRAM is a kind of a writable/readable memory (RAM) by random access and employs a flip-flop circuit or the like as a storage element. In recent years, it has been increasingly difficult to develop stably operating SRAMs following downsizing of integrated circuits.

If a magnitude of wirings (a design rule) forming the SRAM is made small, an irregularity in threshold voltage becomes conspicuous among transistors constituting the flip-flop circuit. This results in operation failures such as deterioration in stability of various operations performed by the SRAM and deterioration in writing characteristic. Particularly for the SRAM, improvement in stability and improvement in writing characteristic are in a tradeoff relationship. For this reason, it is disadvantageously quite difficult to improve both the stability and the writing characteristic.

To solve the problem, there is known a method of dividing a bit line used to write or read data to or from a storage element into a plurality of bit lines and further providing a dedicated bit line for data transfer, as disclosed in Japanese Patent Application Laid-Open No. 59-165292. The method disclosed in the Japanese Patent Application Laid-Open No. 59-165292 has the following problems. An area of peripherals of memory cells disadvantageously increases, thus deteriorating area efficiency of the entire SRAM.

For these reasons, it is disadvantageously difficult to downsize the SRAM so as to improve operation stability and writing characteristic according to the conventional technique.

SUMMARY OF THE INVENTION

A semiconductor memory device according to the present invention includes: a sub array including a plurality of memory cells each holding data arranged therein; a memory cell array including a plurality of the sub arrays arranged therein; paired bit lines including a first bit line and a second bit line connected to each of the sub arrays; and a write/read circuit arranged to correspond to each of the sub arrays, writing data to the sub array, and reading data from the sub array, wherein a pair of the sub array and the write/read circuit is repeatedly arranged along the paired bit lines, allowing the data to be transferred via the write/read circuit and the paired bit lines.

DETAILED DESCRIPTION OF THE EMBODIMENTS

A semiconductor memory device according to embodiments of the present invention will be described hereinafter with reference to the accompanying drawings.

First Embodiment

Figure 1:
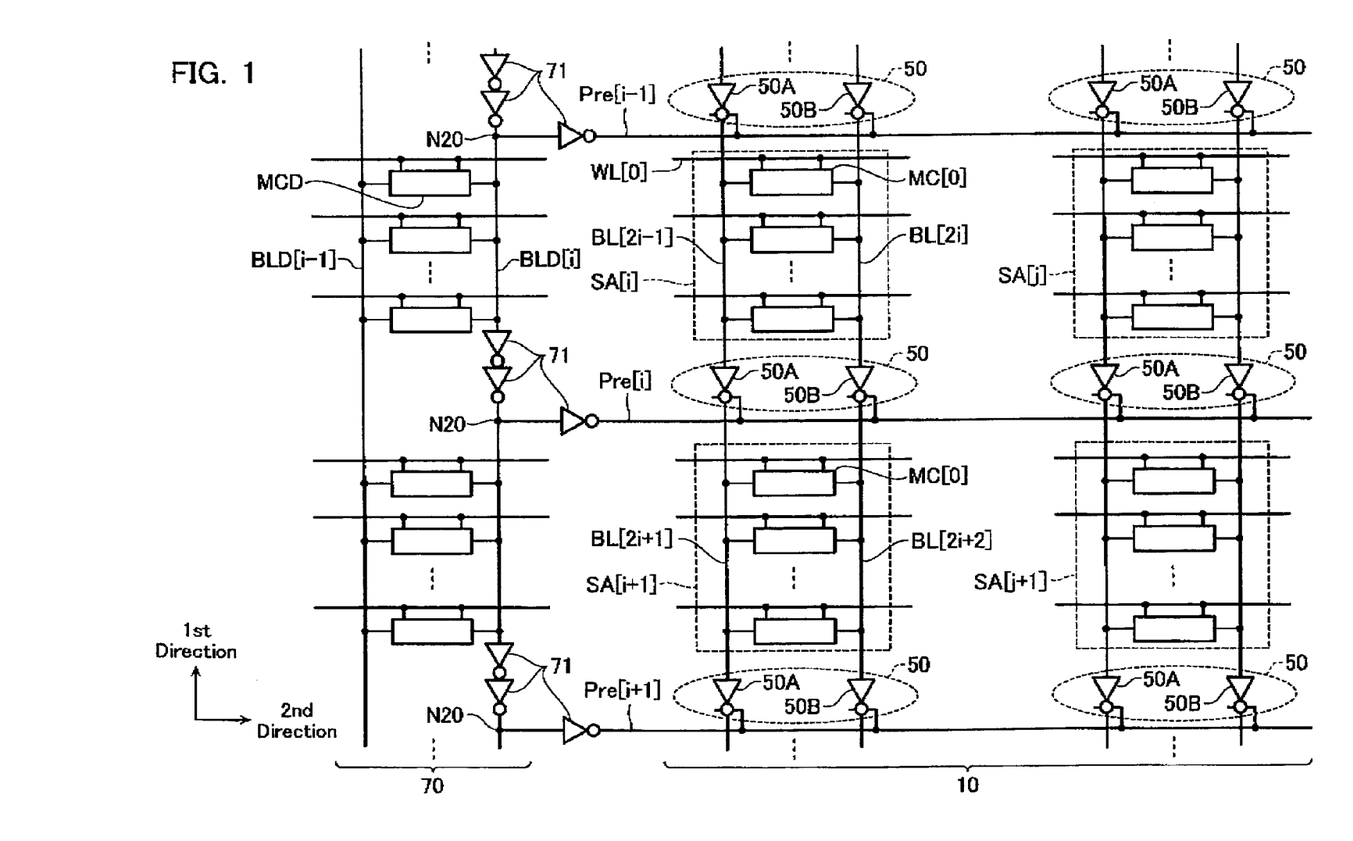
FIG. 1 is a partial circuit diagram of a memory cell array and a dummy circuit in a semiconductor memory device according to a first embodiment of the present invention.

FIG. 1 is a partial configuration diagram of a memory cell array 10 and a dummy circuit 70 constituting a semiconductor memory device (hereinafter, "SRAM") according to a first embodiment of the present invention. As shown in FIG. 1, the memory cell array 10 includes a plurality of sub arrays SAs in each of which a plurality of memory cells MCs are arranged.

Figure 2:
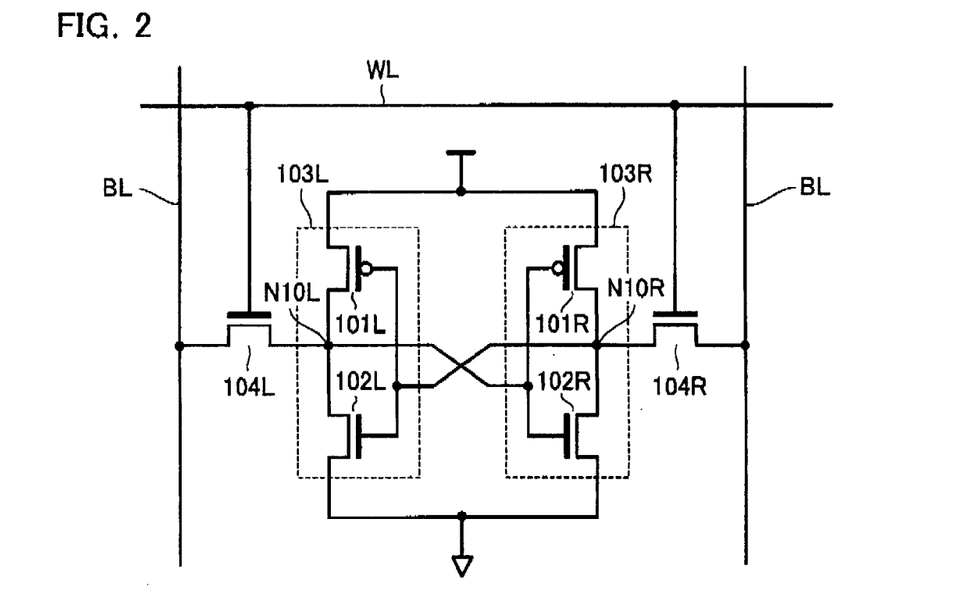
FIG. 2 is a circuit diagram of the memory cell array in the semiconductor memory device according to the first embodiment shown in FIG. 1.

FIG. 2 is a partial configuration diagram of each memory cell MC. The memory cell MC includes two current paths 103 arranged bilaterally symmetrically to each other and each formed by connecting a pMOS transistor 101 and an nMOS transistor 102 in series. The left current path 103 will be referred to as "current path 103L" and the right current path 103 will be referred to as "current path 103R" hereinafter. If the both current paths 103 are generically referred to, they will be denoted by 103 without giving symbol L or R. The same is true of the other constituent elements (101, 102, and 104).

A second main electrode of a selection transistor 104 is connected to a node N10 to which first main electrodes of the pMOS transistor 101 and the nMOS transistor 102 are connected in each current path 103. Further, gate electrodes of the pMOS transistor 101R and the nMOS transistor 102R forming the right current path 103R are connected to the node N10L of the left current path 103L. Likewise, gate electrodes of the pMOS transistor 101L and the nMOS transistor 102L forming the left current path 103L are connected to the node N10R of the right current path 103R.

A first main electrode of the selection transistor 104 connected to each current path 103 is connected to one of paired bit lines BLs and a gate electrode thereof is connected to a word line WL in common. It is assumed, for example, that the first main electrode is a drain electrode and the second main electrode is a source electrode. While the 6-Tr SRAM is employed in the first embodiment, a 4-Tr 2-R SRAM or an SRAM of the other type may be employed.

Referring back to FIG. 1, the semiconductor memory device according to the first embodiment will be continuously described.

A plurality of memory cells MCs is connected to paired bit lines BLs and constitute one sub array SA. A write/read circuit 50 is arranged to correspond to each of a plurality of sub arrays SAs. The sub arrays SAs and corresponding write/read circuits 50 are repeatedly formed along a direction of bit lines BLs ("first direction"). Data can be thereby transferred between the paired bit lines BLs divided in each of a plurality of sub arrays SAs.

In this way, the memory cell array 10 is formed such that the write/read circuits 50 couple a plurality of sub arrays SAs to be repeatedly formed. As shown in FIG. 1, the sub arrays SAs arranged in the same first direction are coupled by the write/read circuits 50 and a plurality of groups of the coupled sub arrays SAs are arranged along a direction of word lines WLs ("second direction"). For convenience of description, the groups of sub arrays SAs will be referred to as one to n columns, respectively. An input buffer, not shown, is connected to an uppermost stage of each column and an output buffer, not shown, is connected to a lowermost stage thereof.

Therefore, in the first embodiment, the divided paired bit lines BLs are also used to transfer data to the output buffer, not shown. It is to be noted that a plurality of paired bit lines BLs are all formed on the same wiring layer.

A conventional SRAM employs a dedicated bit line formed on another wiring layer so as to transfer data held in each memory cell MC to an output buffer. In the first embodiment, in contrast, fewer wiring layers than those of the conventional SRAM can be formed because of use of the divided paired bit lines BLs for data transfer.

Figure 3A:
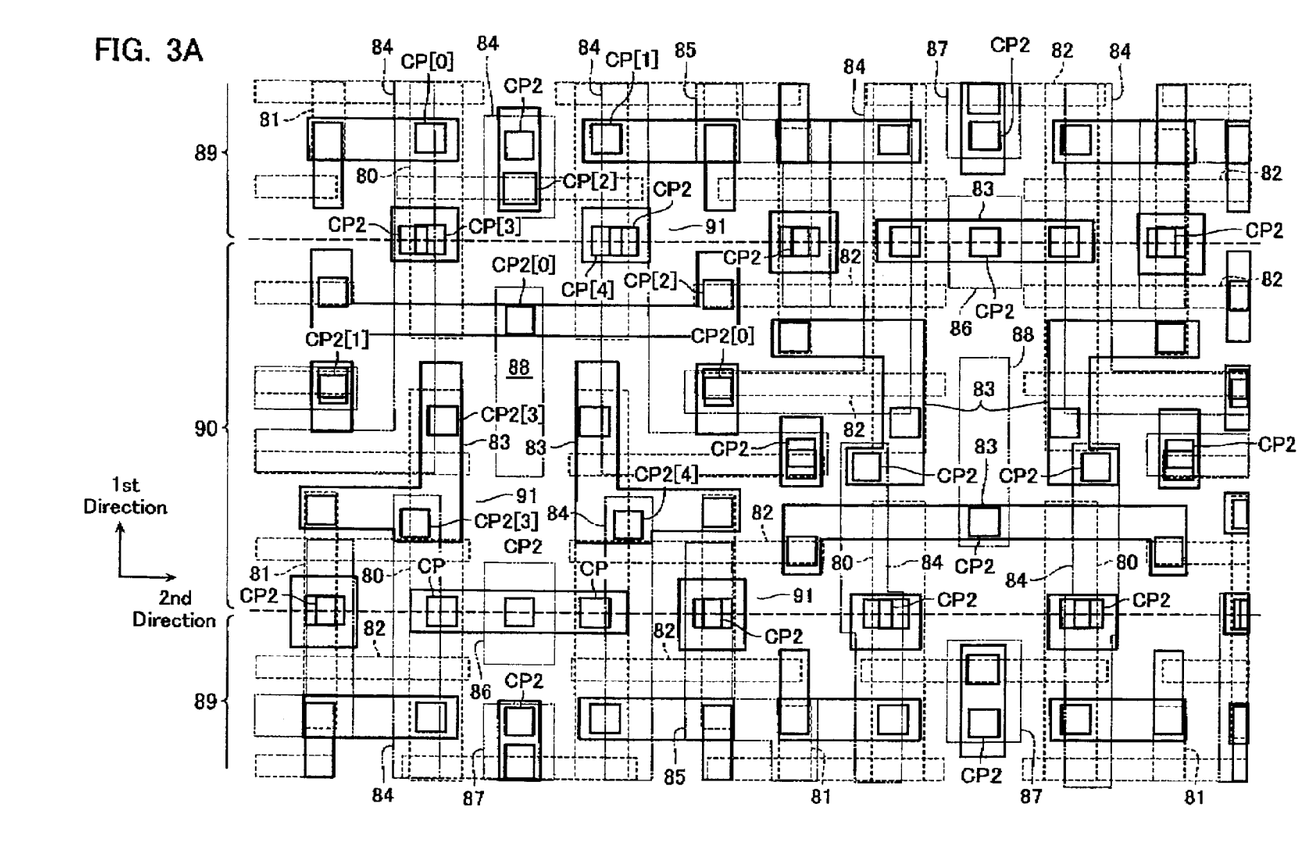
FIG. 3A is a plan view of the memory cell array in the semiconductor memory device according to the first embodiment shown in FIG. 1.
Figure 3B:
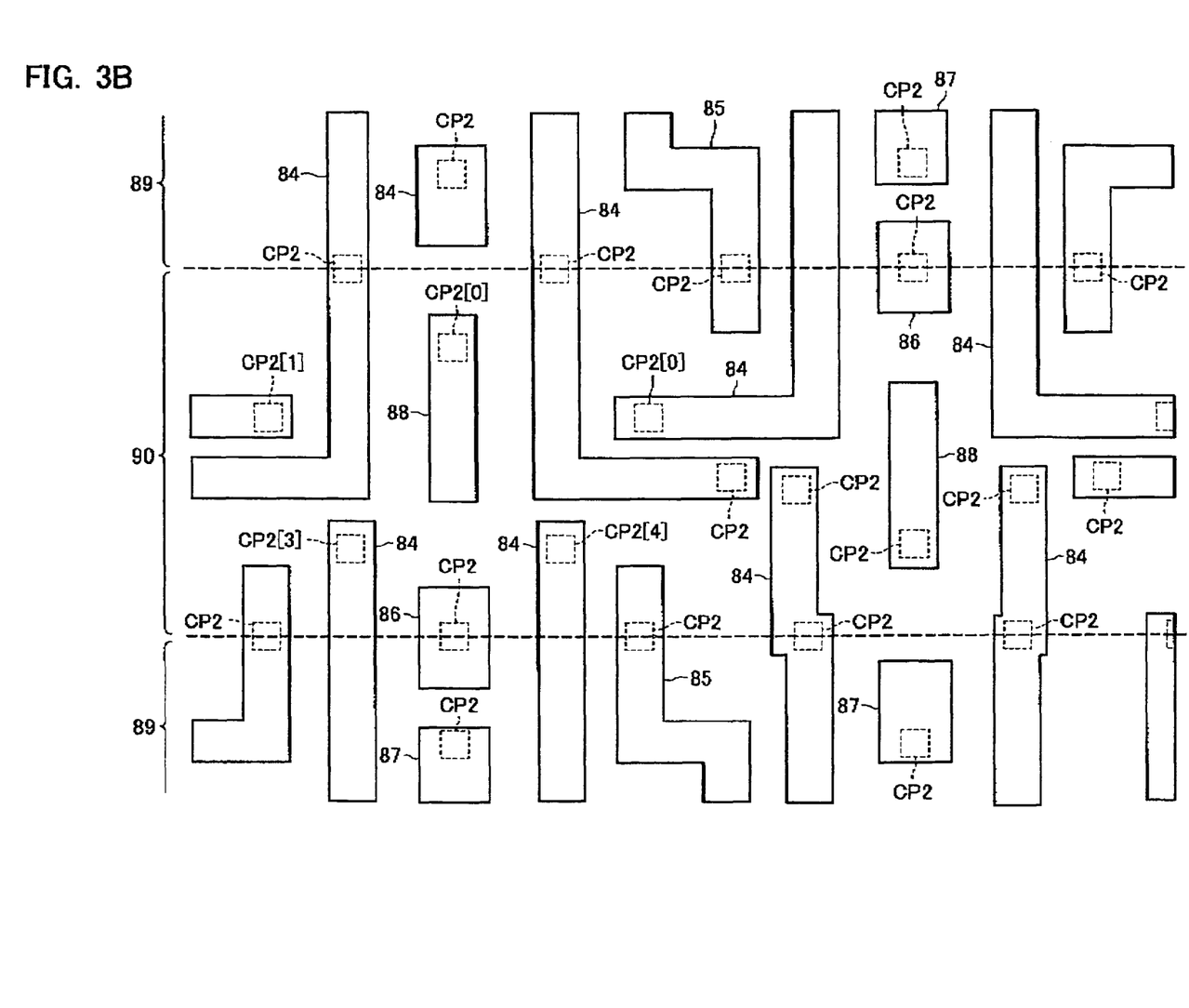
FIG. 3B is a plan view showing only second wiring layers shown in FIG. 3A.
Figure 3C:
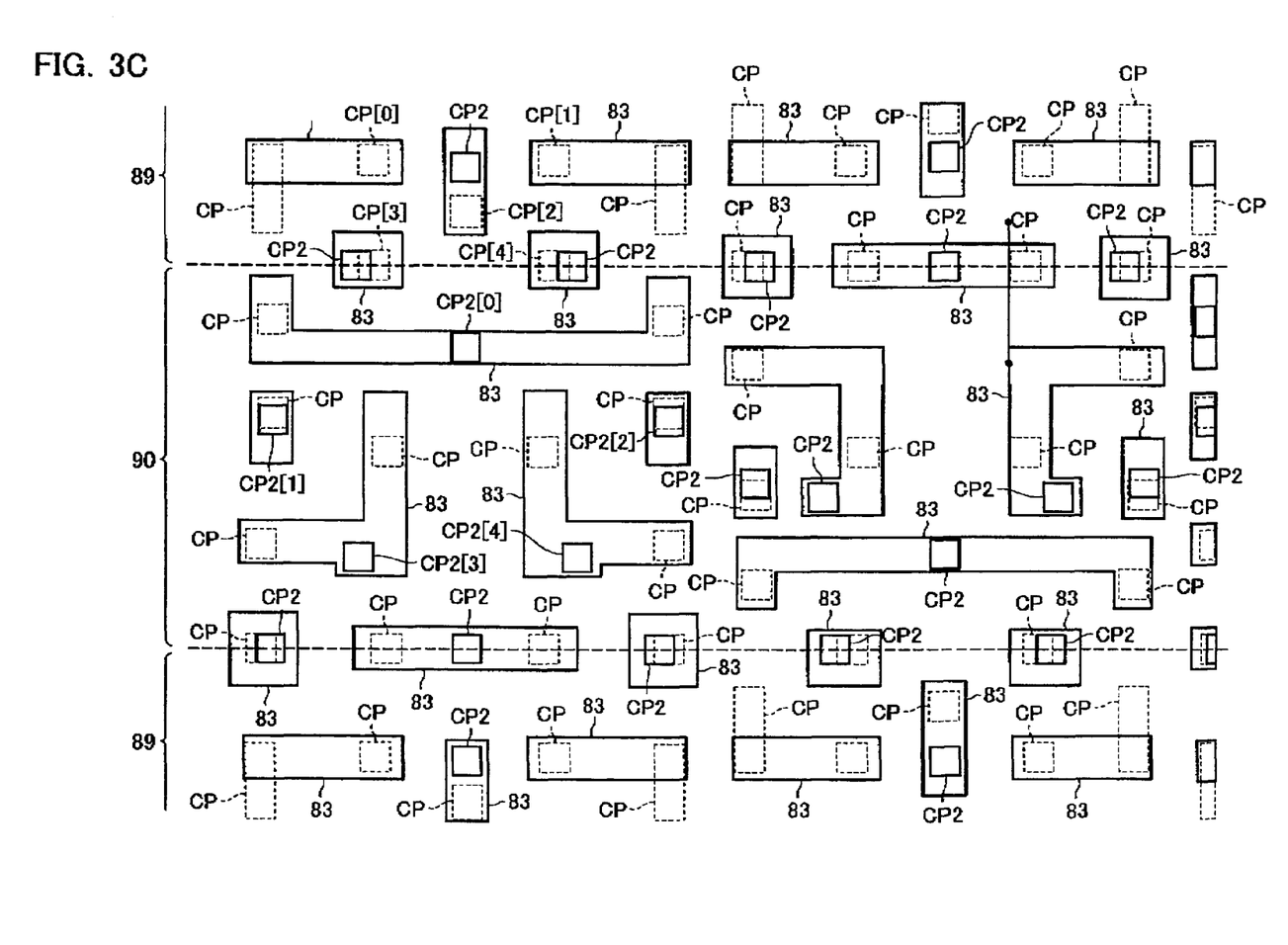
FIG. 3C is a plan view showing a first wiring layer shown in FIG. 3A.
Figure 3D:
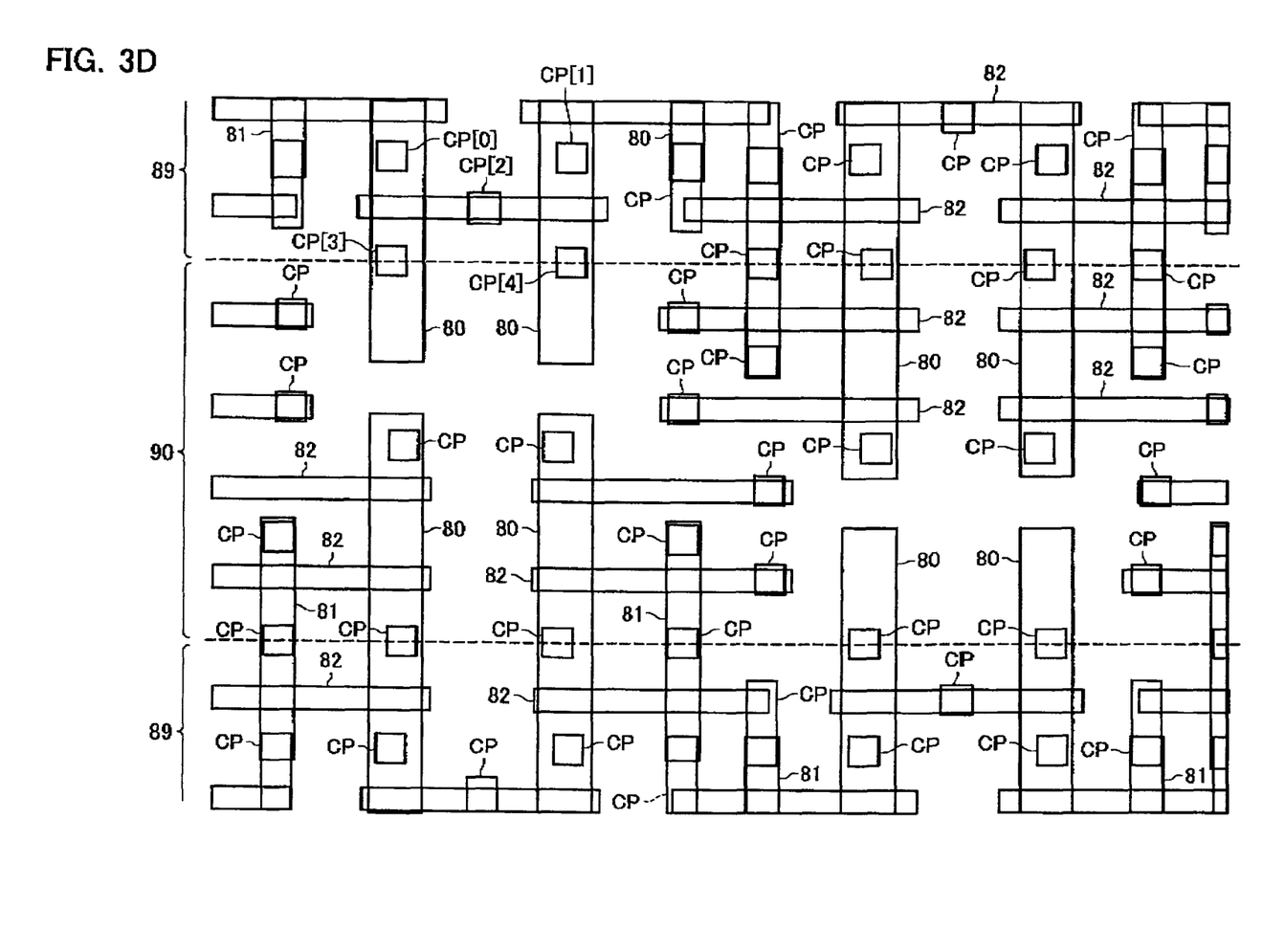
FIG. 3D is a plan view showing gate lines, a diffusion layer, and contact plugs shown in FIG. 3A.

An internal configuration of the memory cell array 10 constituting the SRAM according to the first embodiment will be described next with reference to FIGS. 3A to 3D. FIG. 3A is a partial plan view of the memory cell array 10 and FIGS. 3B to 3D are plan views showing wiring layers of the memory cell array 10 shown in FIG. 3A, respectively. In FIGS. 3B to 3D, an upper wiring layer relative to that shown in FIG. 3D is shown in FIG. 3C and an upper wiring layer relative to that shown in FIG. 3C is shown in FIG. 3B. FIG. 3A shows portions in which the write/read circuits 50 couple the memory cells MCs arranged along the first direction. Accordingly, in FIG. 3A, regions 89 in which the memory cells MCs are formed and a region 90 in which the write/read circuits 50 are formed are present.

The memory cell array 10 includes an N-type diffusion layer 80 and a P-type diffusion layer 81 formed in a well 91 of a silicon substrate (hereinafter, simply "substrate"). Furthermore, gate lines 82 are formed to cross the diffusion layers 80 and 81. FIG. 3D shows the diffusion layers 80 and 81, the gate lines 82, and contact plugs CPs coupling the diffusion layers 81 and 81 and the gate lines 82 to a first wiring layer 83 shown in FIG. 3C, which are formed on a surface layer of the substrate.

FIG. 3C shows the first wiring layer 83 and contact plugs CP2 coupling the first wiring layer 83 to second wiring layers 84 to 88 shown in FIG. 34. Furthermore, positions of the contact plugs CPs coupling the surface layer of the substrate shown in FIG. 3D to the first wiring layer 83 are indicated by dotted line identical in shape to the contact plugs CPs shown in FIG. 3D, respectively. For example, a contact plug CP[0] shown in FIG. 3D is connected to a position of a contact plug CP[0] indicated by a dotted line in FIG. 3C, and a contact plug CP[1] shown in FIG. 3D is connected to a position of a contact plug CP[1] indicated by a dotted line in FIG. 3C. The same is true of contact plugs CP[2] to CP[4]. The other contact plugs CPs are connected to dotted lines indicated at positions corresponding to the contact plugs CPs shown in FIG. 3D, respectively.

FIG. 3B shows bit lines 84, VDD lines 85, VSS lines 86, word lines 87, and signal lines Pre 88 formed on the second wiring layer. Similarly to FIG. 3C, positions of the contact plugs CP2 coupling the first wiring layer 83 to the second wiring layers 84 to 88 are indicated by dotted lines identical in shape to the contact plugs CP2 shown in FIG. 3C, respectively.

Figure 4:
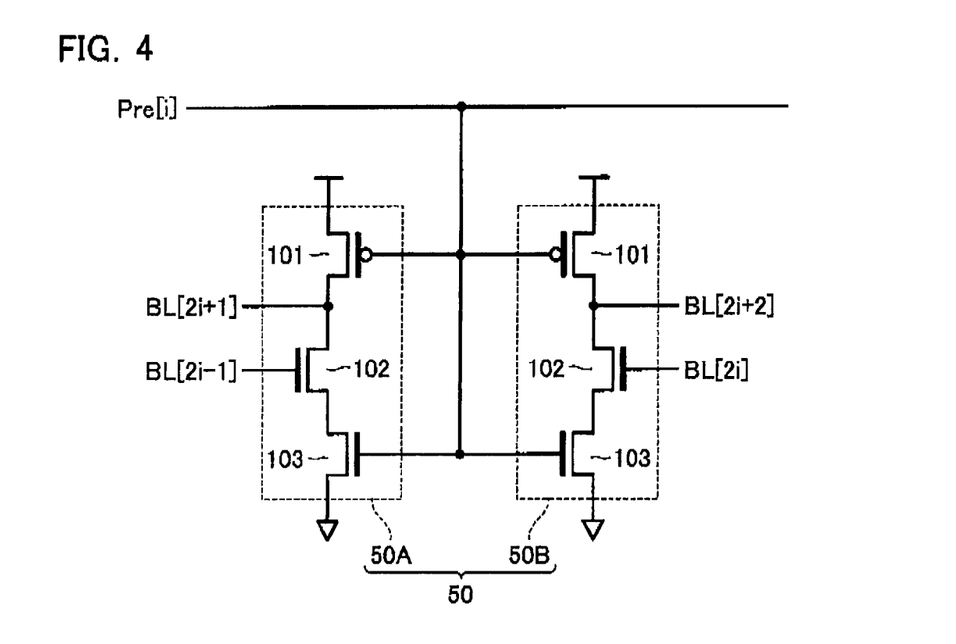
FIG. 4 is a circuit diagram of a write/read circuit in the semiconductor memory device according to the first embodiment shown in FIG. 1.

A configuration of each of the write/read circuits 50 will be described next. FIG. 4 is a configuration diagram of the write/read circuit 50. The write/read circuit 50 formed between sub arrays SA[i] and SA[i+1] will be described by way of example.

The sub array SA[i] is connected to bit lines BL[2$i$−1] and BL[2$i$] and the sub array SA[i+1] is connected to bit lines BL[2$i$+1] and BL[2$i$+2].

The write/read circuit 50 is configured to include a first current path 50A and a second current path 50B. The first current path 50A is formed by connecting a pMOS transistor 101, a first nMOS transistor 102, and a second nMOS transistor 103 in series in this order. The bit line BL[2$i$−1] is connected to a gate electrode of the first nMOS transistor 102. The bit line BL[2$i$+1] is connected to first main electrodes of the pMOS transistor 101 and the first nMOS transistor 102. A signal line Pre[i] is connected to gate electrodes of the pMOS transistor 101 and the second nMOS transistor 102. A first voltage is applied to the signal line Pre[i] if data is to be transferred to the bit line BL[2$i$+1] and a second voltage is applied thereto if the bit line BL[2$i$+1] is to be precharged. For example, the first voltage is 3 volts (V) and the second voltage is 0 V. The first voltage may be higher than 3 V and the second voltage may be lower than 0 V. For example, the first main electrode is a drain electrode and the second main electrode is a source electrode.

As shown in FIG. 4, the second current path 50B is formed bilaterally symmetrical to the first current path 50A about the signal line Pre[i]. The bit line BL[2$i$] is connected to a position symmetrical to that of the bit line BL[2$i$−1] and the bit line BL[2$i$+2] is connected to a position symmetrical to that of the bit line BL[2$i$+1].

The signal line Pre[i] is connected to the dummy circuit 70. The relationship between the dummy circuit 70 and the memory cell array 10 will now be described with reference to FIGS. 1 and 4.

Similar to the memory cell array 10, the dummy circuit 70 is formed by connecting a plurality of sub arrays SAs each formed by connecting a plurality of memory cells MCDs to a pair of bit lines BLD[i−1] and BLD[i] along the first direction. Although it is preferable that the number of memory cells MCDs forming each sub array SA of the dummy circuit 70 is equal to that of memory cells MCs forming each sub array SA of the memory cell array 10, the former number may be smaller than the latter number.

A configuration of the dummy circuit 70 differs from that of the memory cell array 10 in that not the write/read circuits 50 but inverters 71 couple a plurality of sub arrays SAs. As shown in FIG. 1, in the dummy circuit 70, a plurality of sub arrays SAs are coupled to one another by two inverters 71 connected in series. It is to be noted that the inverters 71 coupling the sub arrays SA are arranged on one of the paired bit lines BLDs constituting the sub arrays SAs.

As shown in FIG. 1, the signal line Pre[i] is connected in common to the gate electrodes of the MOS transistors in each of the write/read circuits 50 arranged along the second direction in the memory cell array 10. It is necessary to supply data inverted from data stored in each of the memory cells MCs of the dummy circuit 70 to the gate electrodes of the MOS transistors in each write/read circuit 50. Due to this, one inverter 71 is connected in series to the signal line Pre[i]. Although the number of inverters 71 connected in series to the signal line Pre[i] is one in the first embodiment, the number of inverters 71 may be an odd number other than one.

Figure 5A:
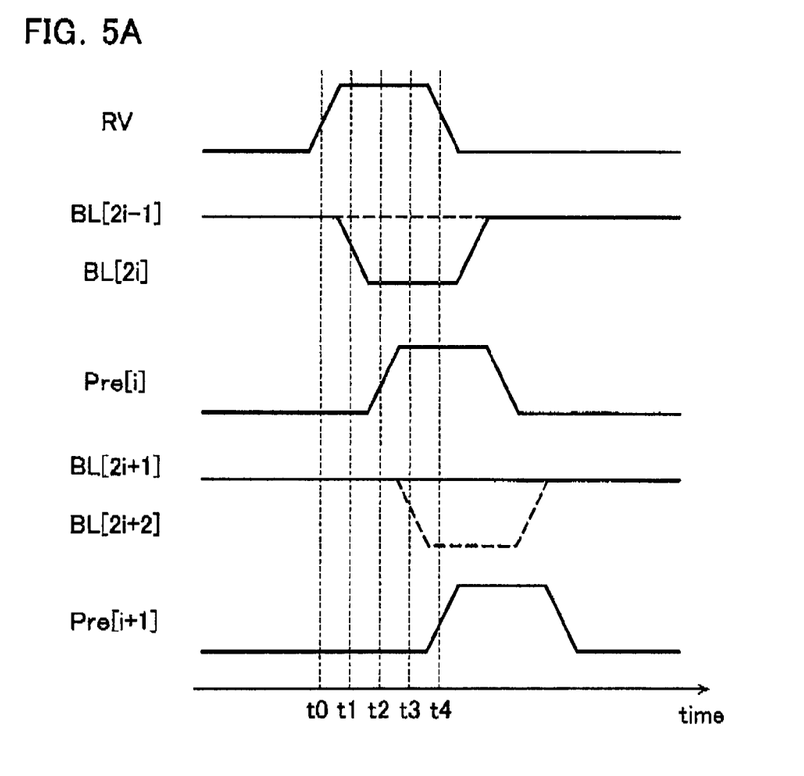
FIG. 5A is a timing chart of read operation performed by the semiconductor memory device according to the first embodiment shown in FIG. 1.
Figure 5B:
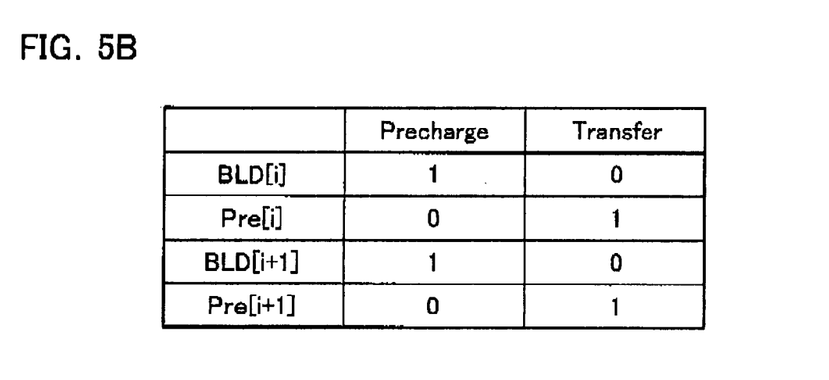
FIG. 5B is a truth table related to operations performed by the write/read circuit and the dummy circuit in the semiconductor memory device according to the first embodiment shown in FIG. 1.

Write/read operations performed by the SRAM according to the first embodiment will be described next with reference to FIGS. 1, 5A, 5B, and 6. FIG. 5A is a timing chart of the read operation and FIG. 5B is a truth table related to the read operation. The read operation will first be described while referring to an instance of reading data from a memory cell MC[0] in the sub array SA[i] shown in FIG. 1 by way of example.

As shown in FIG. 5A, before timing t0, that is, on standby, all bit lines BLs are in a precharge state ("1" state). At the timing t0, a read voltage RV is applied to a word line WL[0] connected to the memory cell MC[0]. Accordingly, at timing t1, data read from the memory cell MC[0] is output to the bit lines BL[2*i*−1] and BL[2*i*]. For example, "1" is output to the bit line BL[2*i*−1] and "0" is output to the bit line BL[2*i*].

Next, the read data is transferred to the output buffer, not shown, connected to the lowermost stage of the column. Accordingly, the read data is transferred to the bit lines BL[2*i*+1] and BL[2*i*+2] connected to the sub array SA[i+1] that is the next stage to the sub array SA[i]. To transfer data on the bit lines BL[2*i*−1] and BL[2*i*] to the bit lines BL[2*i*+1] and BL[2*i*+2], it is necessary to set the signal line Pre[i] to "1". Accordingly, it is necessary to set the bit line BLD[i] in the dummy circuit 70 to "0". It is to be noted that the paired bit lines BLDs forming the dummy circuit 70 are similarly in the precharge state ("1" state) on standby.

Fixed data for always setting the bit line BLD[i] to "0" is held in all the memory cells MCDs in the dummy circuit 70. The data held in the memory cells MCDs may be read to set the bit line BLD[i] to "0".

As can be understood, if data is to be transferred from the bit lines BL[2*i*−1] and BL[2*i*] to the bit lines BL[2*i*+1] and BL[2*i*+2], the data held in the memory cells MCDs connected to the bit lines BLD[i] in the dummy circuit 70 is read. By doing so, the signal line Pre[i] turns into "1" at timing t2, and the data inverted from the data output to the bit lines BL[2*i*−1] and BL[2*i*] is transferred to the bit lines BL[2*i*+1] and BL[2*i*+2]. The operation is repeatedly performed and the data is eventually transferred to the output buffer, not shown, connected to the lowermost stage of the column.

As shown in FIG. 5A, it is necessary to control the dummy circuit 70 so as to set the signal line Pre[i] to "1" after the data read from the memory cell MC[0] is completely reflected on the bit lines BL[2*i*−1] and BL[2*i*]. The reason is as follows. If the signal line Pre[i] is set to "1" before the data read from the memory cell MC[0] is completely reflected on the bit lines BL[2*i*−1] and BL[2*i*], data inverted from the precharged data ("1" and "1") is transferred to the bit lines BL[2*i*+1] and BL[2*i*+2]. To prevent this, it is necessary to control the dummy circuit 70 so as to set the signal line Pre[i] to "1" after the data "1" and "0" to be transferred is completely reflected on the bit lines BL[2*i*−1] and BL[2*i*].

Furthermore, it is necessary to set an output from the write/read circuit 50, which is arranged on an upper stage relative to the memory cell MC[0] from which data is to be read, to a high impedance. The reason is as follows. If the output from the write/read circuit 50 arranged on the upper stage relative to the memory cell MC[0] is set to a certain voltage, data may possibly be erroneously written to the memory cell MC[0] by the certain voltage.

Figure 6:
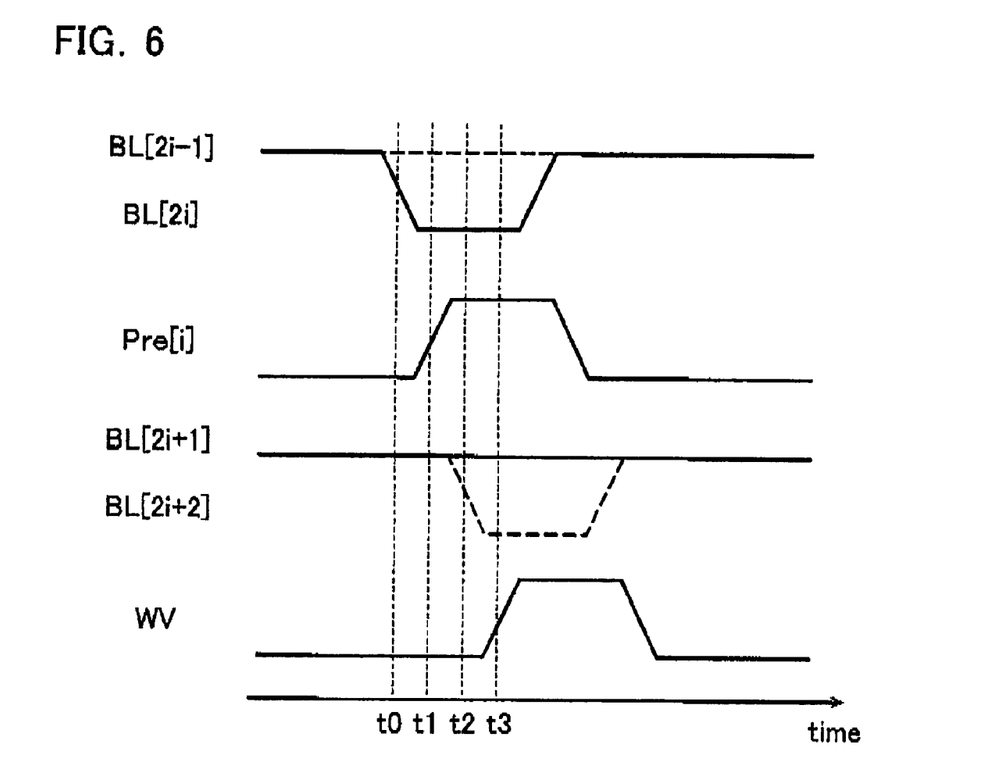
FIG. 6 is a timing chart of write operation performed by the semiconductor memory device according to the first embodiment shown in FIG. 1.

FIG. 6 is a timing chart of the write operation. The write operation will be described with reference to an instance of writing data to the memory cell MC[0] in the sub array SA[i+1] shown in FIG. 1 by way of example. FIG. 6 shows a state in which write data is transferred to the bit lines BL[2*i*−1] and BL[2*i*] and a state after the transfer state.

At timing t0, the write data is transferred to the bit lines BL[2*i*−1] and BL[2*i*]. After the data is completely transferred, the signal line Pre[i] is set to "1" and the data is transferred to the bit lines BL[2*i*+1] and BL[2*i*+2] at timing t1. Further, a write voltage WV is applied to the word line WL[0] to which the memory cell MC[0] is connected, thereby writing the data to the memory cell MC[0]. It is to be noted that the write/read circuit 50 does not perform transfer operation and the data is not transferred after the data is written to the memory cell MC[0].

Second Embodiment

Figure 7:
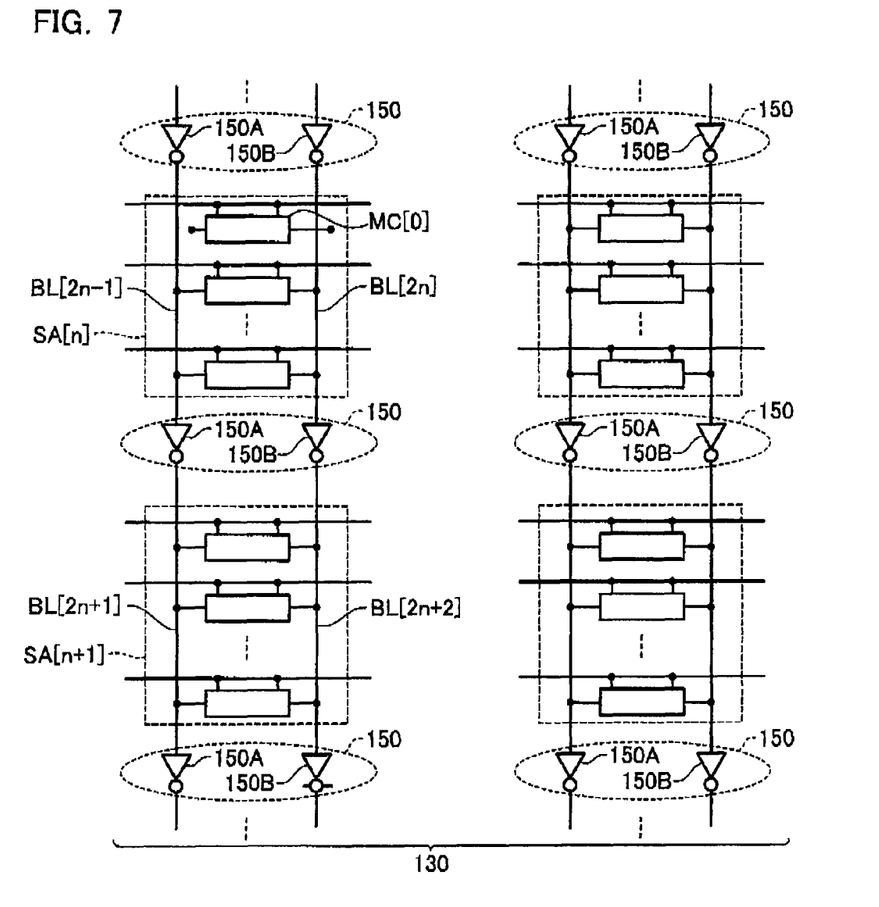
FIG. 7 is a partial circuit diagram of a memory cell array in a semiconductor memory device according to a second embodiment of the present invention.

FIG. 7 is a partial configuration diagram of a memory cell array 130 constituting an SRAM according to a second embodiment of the present invention. As shown in FIG. 7, the memory cell array 130 includes a plurality of sub arrays SAs in each of which a plurality of memory cells MCs are arranged. In this respect, the second embodiment is similar to the first embodiment.

Figure 8:
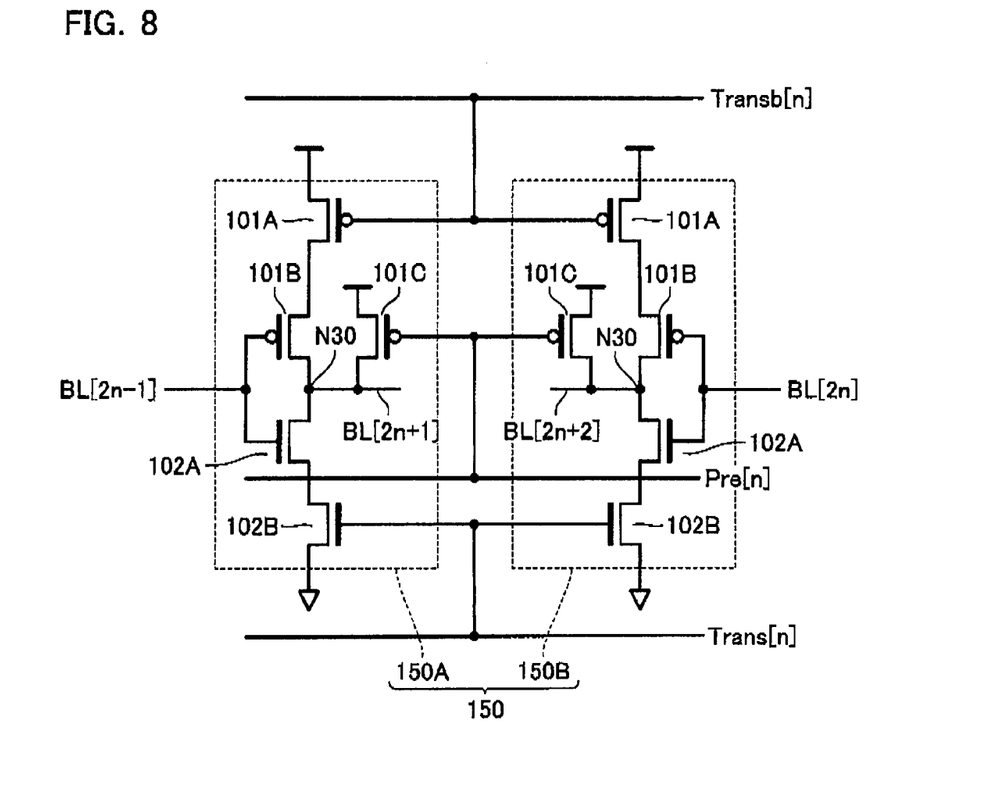
FIG. 8 is a circuit diagram of a write/read circuit in the semiconductor memory device according to the second embodiment shown in FIG. 7.

FIG. 8 is a configuration diagram of each write/read circuit 150. The write/read circuit 150 formed between sub arrays SA[n] and SA[n+1] will be described by way of example. The sub array SA[n] is connected to bit lines BL[2*n*−1] and BL[2*n*] and the sub array SA[n+1] is connected to bit lines BL[2*n*+1] and BL[2*n*+2]. As shown in FIG. 8, the write/read circuit 150 according to the second embodiment is configured to include a first current path 150A and a second current path 150B formed to be bilaterally symmetrical to the first current path 150A.

The first current path 150A is formed by connecting a first pMOS transistor 101A, a second pMOS transistor 101B, a third pMOS transistor 101C, a first nMOS transistor 102A, and a second nMOS transistor 102B in series in this order. A main electrode of the third pMOS transistor 101C is connected to a node N30 to which the second pMOS transistor 101B and the first nMOS transistor 102A are connected. The bit line BL[2*n*−1] is connected to gate electrodes of the second pMOS transistor 101B and the first nMOS transistor 102A. The bit line BL[2*n*+1] is connected to the node N30. A signal line Pre[n] is connected to a gate electrode of the third pMOS transistor 101C. A first voltage is applied to the signal line Pre[n] if data is to be transferred from the bit line BL[2*n*−1] to the bit line BL[2*n*+1]. A second voltage is applied to the signal line Pre[n] if the bit line BL[2*n*+1] is to be precharged. A signal line Transb[n] to which a third voltage is applied if data is to be transferred to the bit line BL[2*n*+1] is connected to a gate electrode of the first pMOS transistor 101A. A signal line Trans[n] to which a fourth voltage is applied if data is to be transferred to the bit line BL[2n+1] is connected to a gate electrode of the second nMOS transistor 102B. The first or fourth voltage is, for example, 3 V and the second or third voltages is, for example, 0 V. The first or fourth voltage may be a voltage higher than 3 V and the second or third voltage may be lower than 0 V.

As shown in FIG. 8, the second current path 150B is formed to be bilaterally symmetrical to the first current path 150A about the signal line Pre[n]. The bit line BL[2n] is connected to a position symmetrical to that of the bit line BL[2n−1] and the bit line BL[2n+2] is connected to a position symmetrical to that of the bit line BL[2n+1].

Figure 9:
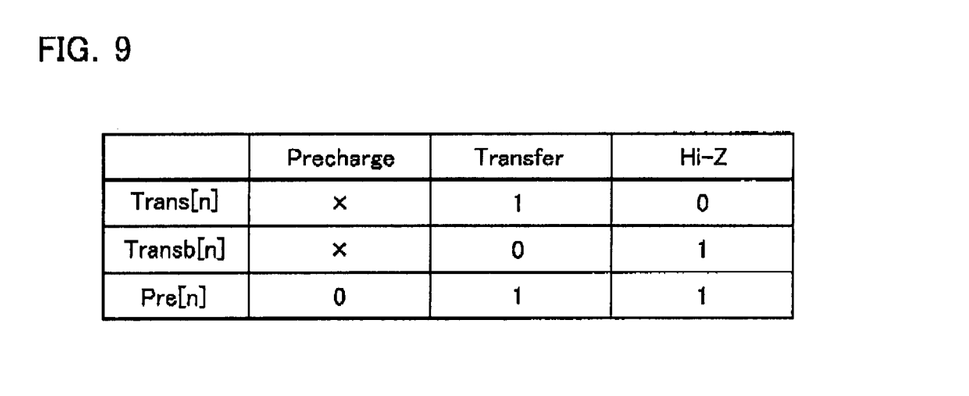
FIG. 9 is a truth table related to operations performed by the write/read circuit in the semiconductor memory device according to the second embodiment of the present invention.

Write/read operations performed by the SRAM according to the second embodiment will be described next with reference to FIGS. 7, 8, and 9. FIG. 9 is a truth table related to the read operation. The read operation will first be described, referring to an instance of reading data from a memory cell MC[0] in the sub array SA[n] shown in FIG. 7 by way of example.

On standby, all bit lines BLs are in a precharge state ("1" state"). A read voltage RV is applied to a word line WL[0] (not shown) connected to the memory cell MC[0] from which data is to be read. Accordingly, data read from the memory cell MC[0] is output to the bit lines BL[2n−1] and BL[2n]. For example, "1" is output to the bit line BL[2n−1] and "0" is output to the bit line BL[2n]. The read operation according to the second embodiment is similar to that according to the first embodiment in these respects.

Next, the read data is transferred to an output buffer, not shown, connected to a lowermost stage of a column to which the sub array SA[n] belongs. Accordingly, the read data is transferred first to the bit lines BL[2n+1] and BL[2n+2]. To transfer data on the bit lines BL[2n−1] and BL[2n] to the bit lines BL[2n+1] and BL[2n+2], it is necessary to set the signal line Pre[n] to "1", to set the signal line Transb[n] to "0", and to set the signal line Trans[n] to "1", as shown in FIG. 9. A controller, not shown, controls these settings.

Furthermore, it is necessary to set an output from the write/read circuit 150 arranged on an upper stage relative to the memory cell MC[0] from which data is to be read to a high impedance if the data is to be read from the memory cell MC[0]. Therefore, as shown in FIG. 9, if the output from the write/read circuit 150 is set to the high impedance, then the signal line Pre[n] is controlled to be set to "1", the signal line Transb[n] is controlled to be set to "1", and the signal line Trans[n] is controlled to be set to "0".

Similar to the first embodiment, during the write operation, data is continuously transferred from an input buffer, not shown, connected to an uppermost stage of the column to the memory cell MC[0] to which write data is to be written. The transfer operation performed by the write/read circuit 150 during the write operation is similar to that during the read operation.

The embodiments of the present invention have been described so far. However, the present invention is not limited to the embodiments but various changes, modifications, replacements, additions, deletions and the like can be made of the present invention within the scope of the spirit of the present invention.

What is claimed is:

1. A semiconductor memory device comprising:
a sub array including a plurality of memory cells each holding data arranged therein;
a memory cell array including a plurality of the sub arrays arranged therein;
paired bit lines including a first bit line and a second bit line connected to each of the sub arrays; and
a write/read circuit arranged to correspond to each of the sub arrays, writing data to the sub array, and reading data from the sub array,
wherein a pair of the sub array and the write/read circuit is repeatedly arranged along the paired bit lines, allowing the data to be transferred via the write/read circuit and the paired bit lines,
wherein the write/read circuit is configured to be able to change over between a transfer state, in which the data can be transferred between the paired bit lines connected to one of the sub arrays arranged on a front stage and the paired bit lines connected to other one of the sub arrays arranged on a rear stage, and a precharge state in which the paired bit lines are precharged, and
wherein the write/read circuit switches over a state from the precharge state to the transfer state after the data read from the memory cells is reflected on the paired bit lines connected to one of the sub arrays arranged on the front stage.

2. The semiconductor memory device according to claim 1, wherein the write/read circuit arranged on an upper stage relative to the paired bit lines to which the data is being read from the memory cells is set to a high impedance state.

3. The semiconductor memory device according to claim 1, wherein the write/read circuit includes:
a first current path arranged between the first bit line connected to one of the sub arrays arranged on a front stage and the first bit line connected to other one of the sub arrays arranged on a rear stage; and
a second current path arranged between the second bit line connected to one of the sub arrays arranged on the front stage and the second bit line connected to the other one of the sub arrays arranged on the rear stage.

4. The semiconductor memory device according to claim 3, wherein the write/read circuit is configured to be able to change over between a transfer state, in which the data can be transferred between the paired bit lines connected to one of the sub arrays arranged on the front stage and the paired bit lines connected to other one of the sub arrays arranged on the rear stage, and a precharge state in which the paired bit lines are precharged.

5. The semiconductor memory device according to claim 1, wherein the paired bit lines are divided in each of the sub arrays, and
wherein the write/read circuit is configured to be able to change over between a transfer state, in which the data can be transferred between the paired bit lines connected to one of the sub arrays arranged on a front stage and the paired bit lines connected to other one of the sub arrays arranged on a rear stage, and a precharge state in which the paired bit lines are precharged.

6. The semiconductor memory device according to claim 1, wherein the paired bit lines are divided in each of the sub arrays, and
the write/read circuit includes:
a first current path arranged between the first bit line connected to one of the sub arrays arranged on a front stage and the first bit line connected to other one of the sub arrays arranged on a rear stage; and
a second current path arranged between the second bit line connected to one of the sub arrays arranged on the front stage and the second bit line connected to the other one of the sub arrays arranged on the rear stage.

7. The semiconductor memory device according to claim 1, further comprising a dummy circuit including a plurality of the memory cells connected to one pair of bit lines, wherein the write/read circuit operates based on the data stored in the memory cells in the dummy circuit.

8. The semiconductor memory device according to claim 1, wherein the write/read circuit includes:
a first current path constituted by connecting a first pMOS transistor and first and second nMOS transistors in series in order; and
a second current path constituted by connecting a second pMOS transistor and third and fourth nMOS transistors in series in order,
the first bit line connected to one of the sub arrays arranged on a front stage is connected to a gate electrode of the first nMOS transistor,
the first bit line connected to other one of the sub arrays arranged on a rear stage is connected to a first main electrode of the first pMOS transistor and a first main electrode of the first nMOS transistor,
a first signal line is connected to a gate electrode of the first pMOS transistor and a gate electrode of the second nMOS transistor,
the second bit line connected to one of the sub arrays arranged on the front stage is connected to a gate electrode of the third nMOS transistor,
the second bit line connected to the other one of the sub arrays arranged on the rear stage is connected to a first main electrode of the second pMOS transistor and a first main electrode of the third nMOS transistor,
the first signal line is connected to a gate electrode of the second pMOS transistor and a gate electrode of the fourth nMOS transistor, and
a first voltage is applied to the first signal line if the data is to be transferred from the paired bit lines connected to one of the sub arrays arranged on the front stage to the paired bit lines connected to the other one of the sub arrays arranged on the rear stage, and a second voltage is applied to the first signal line if the paired bit lines are to be precharged.

9. The semiconductor memory device according to claim 1, wherein the write/read circuit includes:
a first current path constituted by connecting first and second pMOS transistors and first and second nMOS transistors in series in order, and by connecting one of main electrodes of a third pMOS transistor to a first node between the second pMOS transistor and the first nMOS transistor; and
a second current path constituted by connecting fourth and fifth pMOS transistors and third and fourth nMOS transistors in series in order, and by connecting one of main electrodes of a sixth pMOS transistor to a second node between the fifth pMOS transistor and the third nMOS transistor,
the first bit line connected to one of the sub arrays arranged on a front stage is connected to a gate electrode of the second pMOS transistor and a gate electrode of the first nMOS transistor,
the first bit line connected to one of the sub arrays arranged on the front stage is connected to the first node,
a first signal line is connected to a gate electrode of the third pMOS transistor,
a first voltage is applied to the first signal line if the data is to be transferred from the paired bit lines connected to one of the sub arrays arranged on the front stage to the paired bit lines connected to the other one of the sub arrays arranged on the rear stage, and a second voltage is applied to the first signal line if the paired bit lines are to be precharged,
the second bit line connected to one of the sub arrays arranged on the front stage is connected to a gate electrode of the fifth pMOS transistor and a gate electrode of the third nMOS transistor,
the second bit line connected to the other one of the sub arrays arranged on the rear stage is connected to the second node, and
the first signal line is connected to a gate electrode of the sixth pMOS transistor.

* * * * *